US006756842B2

(12) United States Patent
Mehr et al.

(10) Patent No.: US 6,756,842 B2
(45) Date of Patent: Jun. 29, 2004

(54) AC COUPLED MULTISTAGE HIGH GAIN OPERATIONAL AMPLIFIER

(75) Inventors: Iuri Mehr, North Andover, MA (US); Lawrence A. Singer, Bedford, MA (US); Wenhua Yang, North Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/141,191

(22) Filed: May 8, 2002

(65) Prior Publication Data

US 2003/0210092 A1 Nov. 13, 2003

(51) Int. Cl.[7] ................................................ H03F 1/02
(52) U.S. Cl. .......................... 330/9; 330/51; 330/258
(58) Field of Search ................................ 330/9, 51, 69, 330/258; 327/124; 4/307

(56) References Cited

U.S. PATENT DOCUMENTS 5,600,275 A * 2/1997 Garavan ..................... 327/307
5,745,002 A * 4/1998 Baschirotto et al. ........ 327/554
6,252,454 B1 * 6/2001 Thompson et al. ............ 330/9
6,259,316 B1 * 7/2001 Nagaraj ........................ 330/9

OTHER PUBLICATIONS

Vleugefs et al., *A 2.5V Broadband Multi–Bit Sigma–Delta Modulator with 95dB Dynamic Range*, 2001 IEEE International Solid State Circuits Conference, Session 3, Oversampling ADCs, 3.4, Feb. 5, 2001.

Cho et al., *A 10 b, 20 Msample/s, 35 mW Pipeline A/D Converter*, IEEE Journal of Solid–State Circuits, vol. 30, No. 3, Mar. 1995, pp 166–172.

* cited by examiner

*Primary Examiner*—Nguyen Khanh Van
(74) *Attorney, Agent, or Firm*—Iandiorio & Teska

(57) ABSTRACT

An a.c. coupled multistage high gain operational amplifier includes at least two gain stages, each having an input and an output; an a.c. coupling level shifting capacitance interconnecting the output of a first stage to the input of a second stage; and a charging circuit interconnecting with the a.c. coupling level shifting capacitance and the input of the second stage to charge the a.c. coupling level shifting capacitance in a track phase and to connect the a.c. coupling capacitance to the input of the second stage during a hold phase for dissociating the bias voltages of the stages.

11 Claims, 5 Drawing Sheets

AC COUPLED MULTISTAGE HIGH GAIN OPERATIONAL AMPLIFIER

FIELD OF THE INVENTION

This invention relates to an a.c. coupled high gain multistage operational amplifier.

BACKGROUND OF THE INVENTION

Switched capacitance operational transconductance amplifiers commonly use two stages: a telescopic amplifier with a preamplifier to increase gain without degrading stability and to increase bandwidth. T. B. Cho & P. Gray, "A 10b, 20M sample/s, 35 mW Pipline A/D converter", IEEE JSSC, Mar. 1995, page 166. K. Vleugels, S. Rabii, & B. Woday, "A 2.5 MHz Broadband Multi-Bit ΣΔ Modulator with 95 dB Dynamic Range", Proc. ISSCC, 2001, page 50. However, this places tight voltage headroom restrictions on the preamplifier circuit which is constrained by the bias of the input circuits of the telescopic amplifier. This constraint can be reduced somewhat if NMOS and PMOS devices are used but PMOS devices tend to reduce bandwidth and gain which is undesirable.

BRIEF SUMMARY OF THE INVENTION

It is therefore an object of this invention to provide an improved a.c. coupled high gain multistage operational amplifier.

It is a further object of this invention to provide an improved a.c. coupled high gain multistage operational amplifier which decouples the stages so that the bias voltages in each stage can be independent of each other.

It is a further object of this invention to provide an improved a.c. coupled high gain multistage operational amplifier which decouples the stages so that the device areas at the input of each stage can be independent of each other.

It is a further object of this invention to provide an improved a.c. coupled high gain, high bandwidth, multistage operational amplifier which is advantageous for low voltage designs.

It is a further object of this invention to provide an improved a.c. coupled high gain multistage operational amplifier which cancels the offset of the first stage.

The invention results from the realization that an improved a.c. coupled high gain, high bandwidth, multistage operational amplifier in which the bias voltages of the input devices are independent of each other can be achieved by employing an a.c. coupling capacitance between the stages and charging that capacitance during the track phase when the operational amplifier is not operating and using the charge on the coupling capacitance to bias the next stage during the hold phase without constraining the bias on the input of the previous stage.

This invention features an a.c. coupled multistage high gain operational amplifier including at least two gain stages, each having an input and an output. There is an a.c. coupling level shifting capacitance interconnecting the output of the first stage to the input of the second stage and a charging circuit interconnecting with the a.c. coupling level shifting capacitance and the input of the second stage to charge the a.c. coupling level shifting capacitance in a track phase and to connect the a.c. coupling capacitance to the input of the second stage during a hold phase for dissociating the bias voltages of the stages.

In a preferred embodiment the charging circuit may include a common mode switching circuit interconnected with the a.c. coupling level shifting capacitance and the input of the second stage to charge the a.c. coupling level shifting capacitance in the track phase and to connect the a.c. coupling level shifting capacitance to the input of the second stage during the hold phase. There may be a common mode bias circuit for charging the a.c. coupling level shifting capacitance during the track phase. The stages may be implemented in NMOS. There may be a parasitic capacitance associated with the input of the second stage and the a.c. coupling level shifting capacitance may be larger than the parasitic capacitance. The second stage may include a telescopic amplifier. The telescopic amplifier may include a tail current source. The a.c. coupling level shifting capacitance may effect the cancellation of the offset of the first stage.

BRIEF DESCRIPTION OF THE DRAWINGS

Other objects, features and advantages will occur to those skilled in the art from the following description of a preferred embodiment and the accompanying drawings, in which.

PREFERRED EMBODIMENT

Figure 1:
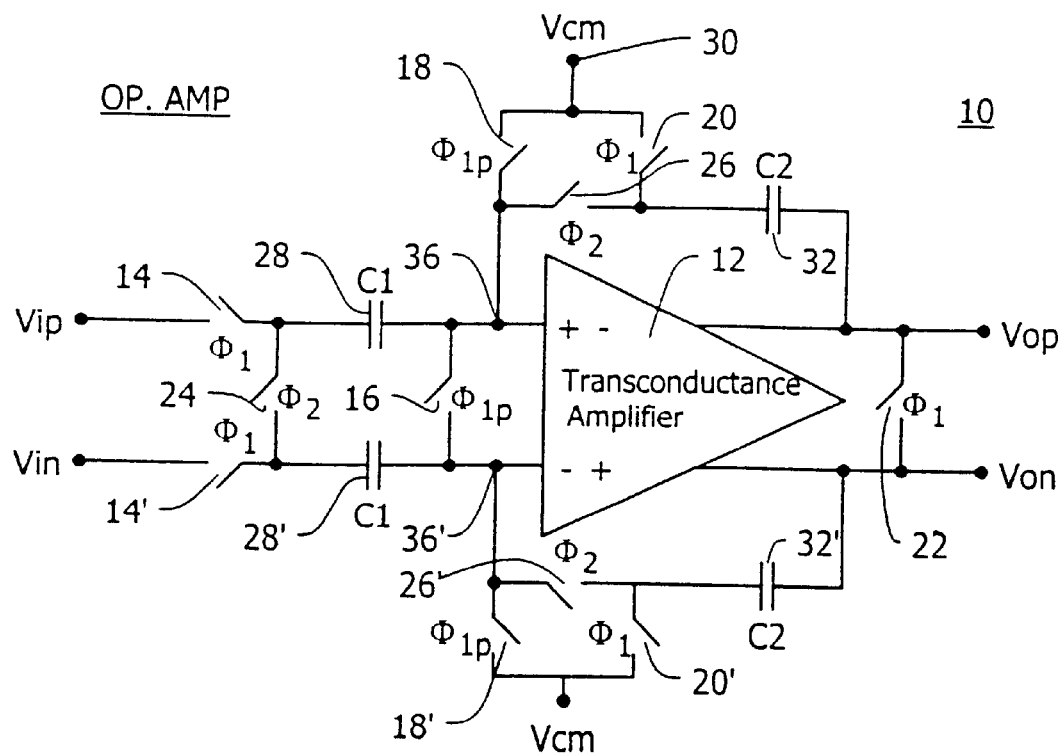
FIG. 1 is a schematic diagram of a prior art operational transconductance amplifier in a switched capacitor application.

There is shown in FIG. 1 a switched capacitor circuit 10 including transconductance amplifier 12 which is operated in a differential mode having two inputs, $V_{ip}$ and $V_{in}$ and two outputs $V_{op}$ and $V_{on}$. In the following description the upper half of FIG. 1 will be described. The lower half operates in exactly the same way and will have like parts labeled with like numbers primed.

Figure 2:
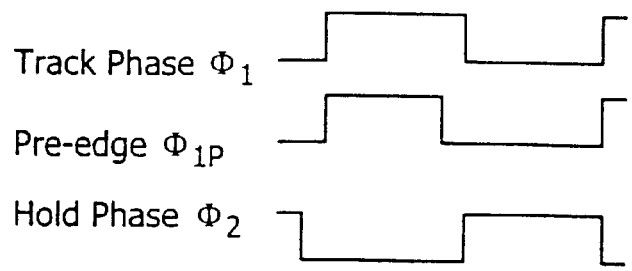
FIG. 2 illustrates waveforms that control the switching in FIG. 1.

Switched capacitor circuit 10 operates in two phases, a track phase, $\Phi_1$, FIG. 2, and a hold phase $\Phi_2$. In a track phase, switches 14, 16, 18, 20, and 22, FIG. 1, are closed and switches 24 and 26 are open. In the track phase then, the voltage at $V_{ip}$ is able to charge one plate of the input capacitance 28 through switch 14, and the other plate to the common mode terminal 30 through switch 18. Toward the end of the track phase the pre-edge signal, $\Phi_{1p}$, FIG. 2, goes low which opens switches 16 and 18 just before the end of the track phase, ($\Phi_1$-high), and the beginning of the hold phase, ($\Phi_2$-high). This causes the end of capacitor 28 (node 36) to float so that the subsequent opening of switch 14 does not introduce any additional charge into capacitor 28. Following this, the rest of the switches, 14, 20, and 22 are opened and then in the hold phase, $\Phi_2$, switches 24 and 26 are closed. This enables capacitor 28 to discharge through switch 24 and transfer its charge to capacitance 32 through switch 26 and the voltage on capacitance 32 then is presented as the output voltage $V_{op}$. The gain of switched capacitor circuit 10 is the input voltage $V_{ip}$ times the capacitance 28 divided by the capacitance of capacitor 32. During hold phase ($\Phi_2$-high) due to the typically very high gain of transconductance amplifier 12, a virtual ground is imposed at terminals 36, 36'. The higher the gain of amplifier 12, the better the virtual ground achieved, and the better the accuracy of the gain of switched capacitor circuit 10. Therefore one of the aims of amplifier 12 is to have a high gain and another is to have wide bandwidth such that it settles to highly accurate values.

Figure 3:
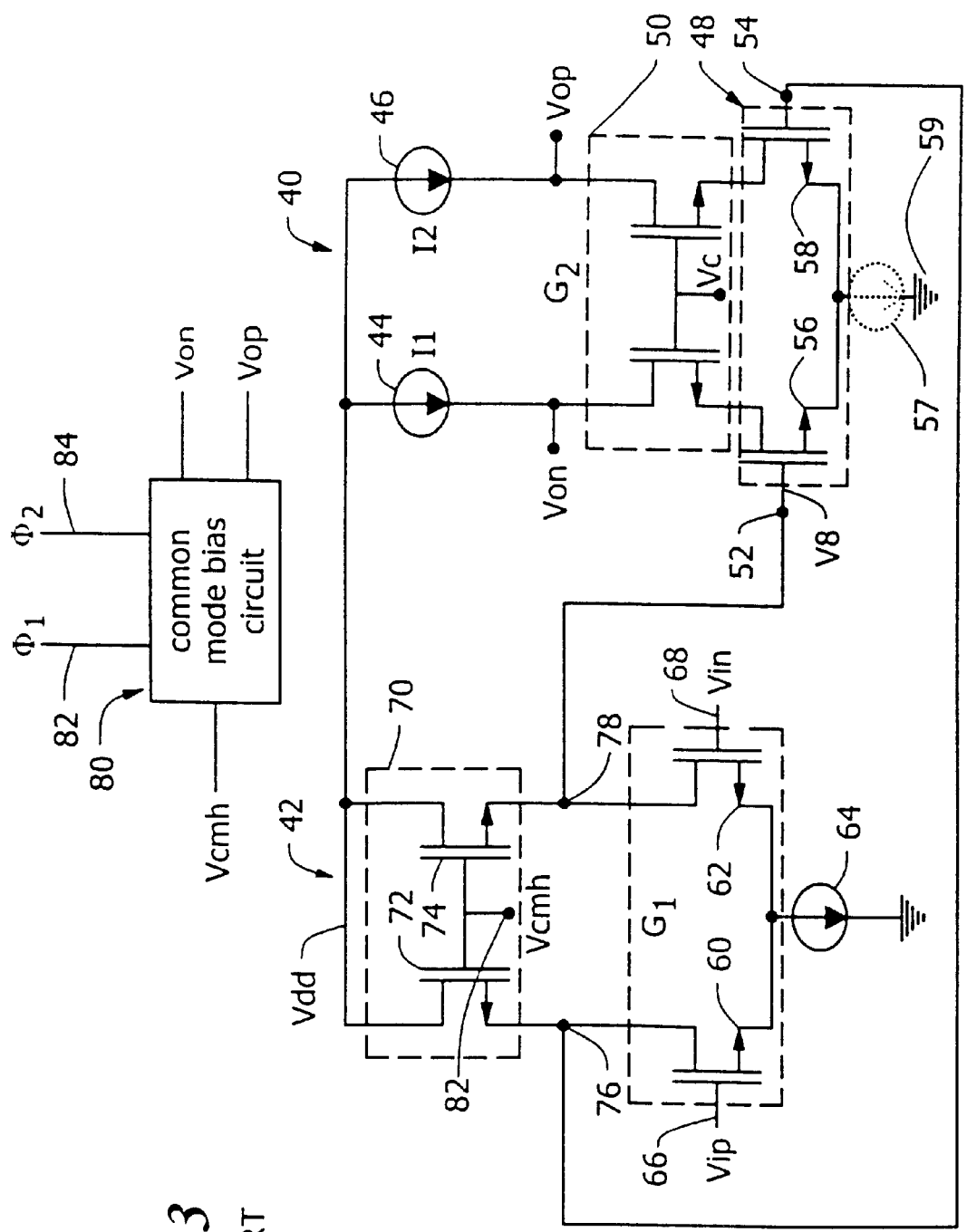
FIG. 3 is a schematic diagram of one implementation of a prior art two-stage transconductance amplifier as shown in FIG. 1.

One approach to improve the gain is to stack cascode transistors used such as in a telescopic amplifier, but stacking the devices requires increased voltage headroom which is not desirable when low-voltage systems are being implemented. The other alternative is to include a number of stages to increase the gain and bandwidth. Such an operational transconductance amplifier 10a, FIG. 3, may include two stages, a telescopic amplifier 40 and a pre-amplifier 42. Telescopic amplifier 40 is a differential amplifier utilizing two current sources 44, 46 a differential input pair 48 and one or more cascode pair circuits 50, which may be stacked to increase gain or may be eliminated if they are not necessary. The inputs to the differential input pair 48 occur at the gates 52, 54 of NMOS transistors 56 and 58. The output of telescopic amplifier 40 is presented at $V_{on}$ and $V_{op}$. Sources 56, 58 may be connected directly or through a tail current source 57 to ground 59. Preamplifier 42 also includes a pair of NMOS transistors 60, 62 whose sources are connected to a tail current source 64 and whose gates 66, 68 constitute the inputs $V_{ip}$, $V_{in}$ to preamplifier 42. Preamplifier 42 also includes a diode connected load 70 composed of NMOS transistors 72 and 74. The output terminals 76, 78 of preamplifier 42 are connected directly to the inputs of telescopic amplifier 40 at gates 52 and 54, respectively. Assuming a gain of $G_1$ for preamplifier 42 and a gain of $G_2$ for telescopic amplifier 40 the total gain of the two stages $$G_{total} = G_1 * G_2 \quad (1)$$

where $G_2 = g_{m56} * R_{out}$ where $g_{m56}$ is the transconductance of transistor 56 or 58 and $R_{out}$ is the output resistance of stage 40

$$G_1 = g_{m60} * 1/g_{m72} = g_{m60}/g_{m72} \quad (2)$$

$g_{m60}$ is the transconductance of transistor 60 or 62 and $g_{m72}$ is the transconductance of transistor 72 or 74.

Common mode bias circuit 80 is responsive to the outputs $V_{on}$ and $V_{op}$ to apply a bias at terminal 83 to the gates of transistors 72 and 74 in further response to the status of track phase signals 82, $\Phi_1$ and hold phase signal 84, $\Phi_2$.

One shortcoming of this approach is that the biasing voltages of the first stage 42 are closely coupled and interdependent with those in the second stage 40. In second stage 40 it is convenient to have the bias at 52, 54 as low as possible at the differential input circuit 48 so that perhaps one or more cascode devices can be stacked above it in the limited headroom that is available. However, it is to the advantage of the operation of the first stage 42 to have a higher bias at those nodes to provide headroom for input transistors 60, 62. Thus, there is a constant trade-off between the two.

Figure 4:
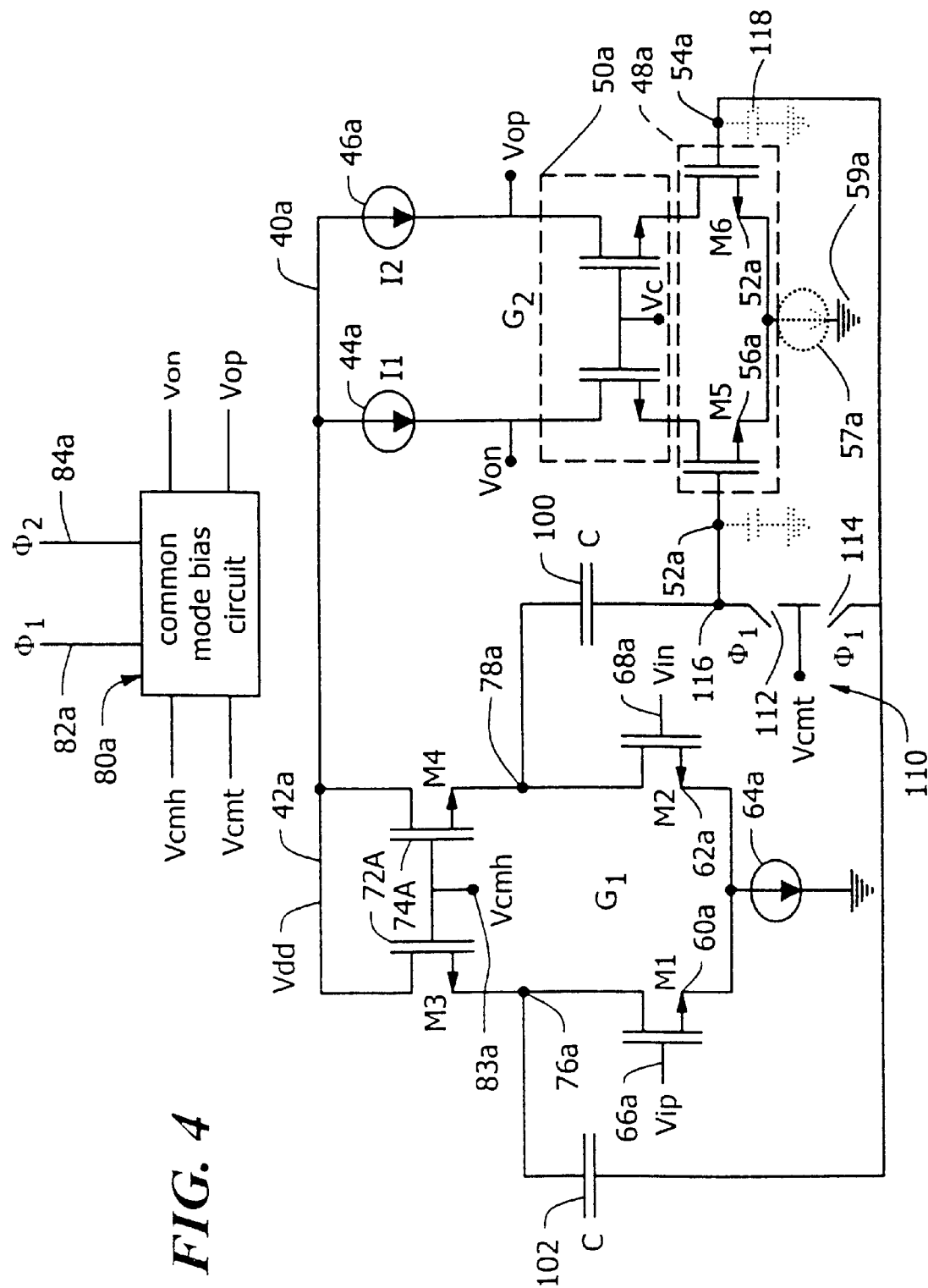
FIG. 4 is a schematic diagram of a transconductance amplifier according to this invention.

In accordance with this invention, to avoid this dilemma over the conflicting preferences for the bias voltages in the first and second stages, a.c. coupling capacitances 100, 102, FIG. 4, are employed. The use of a.c. coupling capacitors 100, 102 isolates the d.c. bias circuits of the second stage 40a from the first stage 42a, but the capacitances 100, 102 must be recharged periodically in order to maintain the proper voltage at the gates 52a and 54a. This is accomplished in accordance with this invention through the common mode bias circuit 80a, which provides signals $V_{cmh}$ during the hold phase and $V_{cmt}$ during the track phase. $V_{cmh}$ interconnects with terminal 83a as in the prior art to provide the common mode return from $V_{on}$ and $V_{op}$. However, in this invention, common mode bias circuit 80a also provides an output $V_{cmt}$ which can conveniently be used by common mode switching circuit 110 to recharge capacitances 100, 102 during the track phase $\Phi_1$ when the operational amplifier is not being used. Thus, during the track phase switches 112 and 114 are closed so that capacitances 100, 102 may be charged to a level determined by common mode bias circuit 80a. Then in the hold phase, when switches 112 and 114 are open, the voltage stored on capacitances 100, 102 are available at gates 52a and 54a independently of the biasing conditions in the first stage 42a. Throughout this description the circuits used to illustrate the prior art and invention are double ended circuits but this is not necessary and is not a limitation of the invention as the invention is applicable whenever there is a track phase or other off-time available.

Although the implementation in FIG. 4 is shown using NMOS devices, this is not a necessary limitation of the invention as PMOS devices may also be used. PMOS devices, however, as explained earlier, place a limitation on bandwidth and gain. The capacitances 100, 102 should be significantly larger than the parasitic capacitance 116, 118 associated with gates 52a and 54a in order to reduce the gain attenuation caused by the parasitic capacitances 116, 118.

Figure 5:
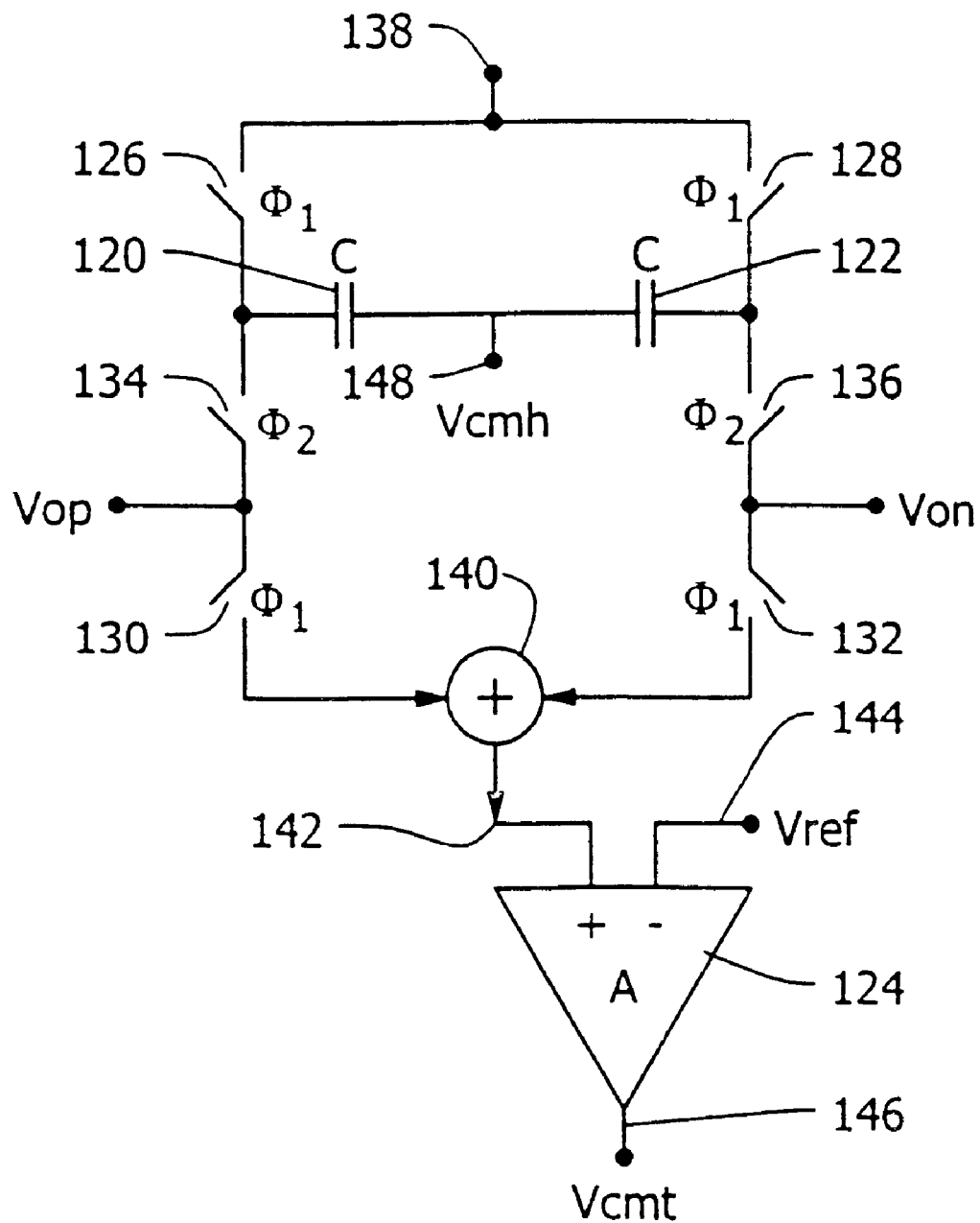
FIG. 5 is a simplified schematic diagram of the common mode bias circuit of FIG. 4 which develops the $V_{cml}$ voltage and the $V_{cmh}$ voltage.

Common mode bias circuit 80a, FIG. 5, may include a pair of coupling capacitors 120, 122 and an amplifier 124. During the track phase, $\Phi_1$, switches 126, 128 and switches 130, 132 are closed and switches 134, 136 are open so that the output common mode reference, $V_{ref\_cm}$, node 138 is connected to capacitors 120, 122 and $V_{op}$ and $V_{on}$ are summed or averaged in summer 140 to provide one input 142 to amplifier 124, which, combined with $V_{ref}$ at input 144 produces $V_{cmt}$ at output 146. During the hold phase, $\Phi_2$, switches 126, 128, 130, and 132 are open while switches 134, 136 are closed and the voltage, $V_{cmh}$, is produced at node 148. 1 f summer 140 provides an average instead of the sum of $V_{op}$ and $V_{on}$, then $V_{ref\_cm}$ can be the same as $V_{ref}$.

Figure 6:
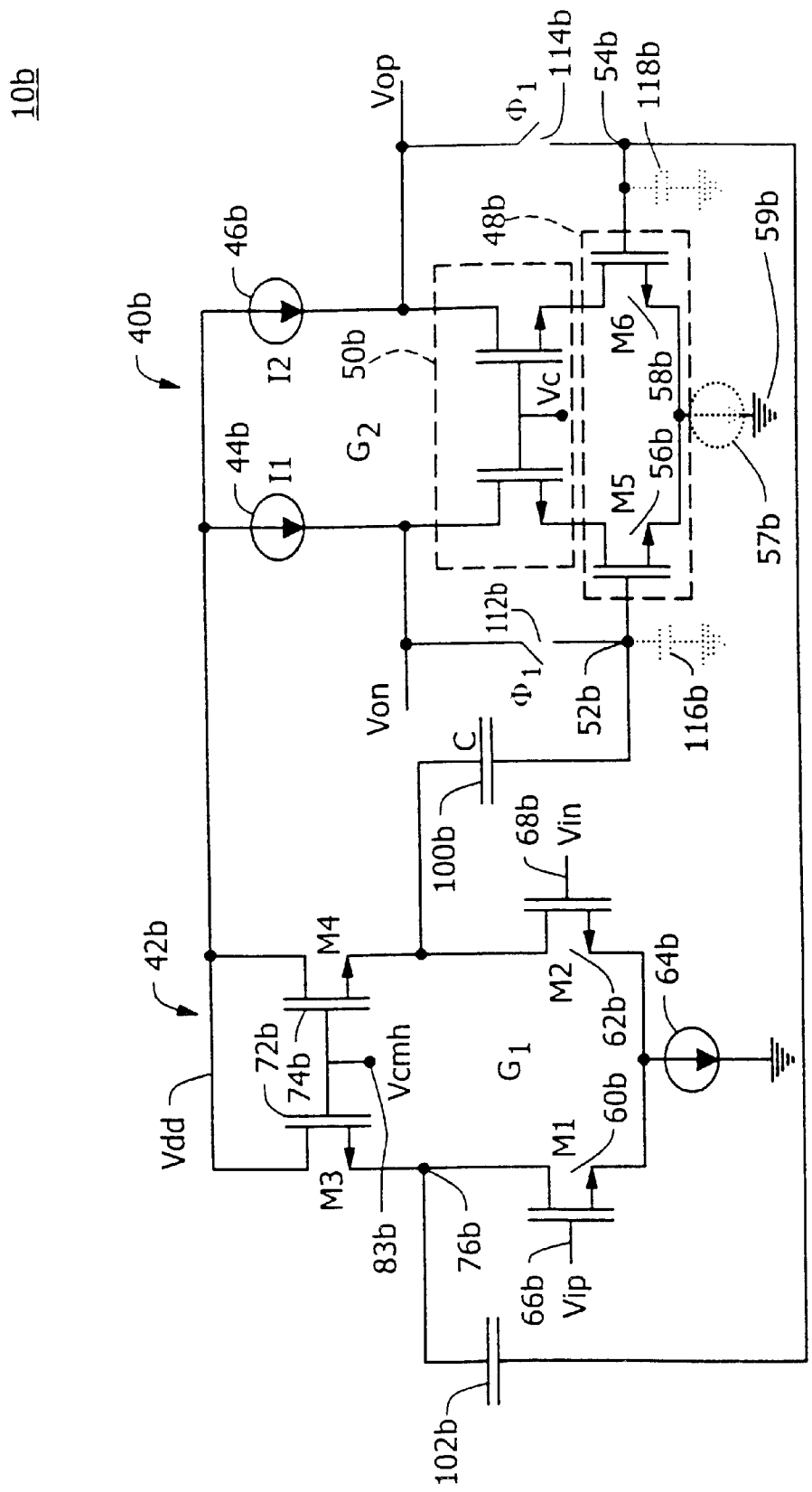
FIG. 6 is a view similar to FIG. 4 of another implementation of a transconductance amplifier according to this invention.

The embodiment of FIG. 4 may be restructed as in FIG. 6 to generate $V_{cmt}$ internally so that the portion of common mode bias circuit 80a, FIG. 5, associated with the generation of $V_{cmt}$ is unnecessary. In FIG. 6 switches 112b, 114b are connected between outputs $V_{on}$, $V_{op}$, respectively, and the gates of transistors, 56b, 58b, respectively. This generates $V_{cmt}$ without, for example, the need for switches 130, 132, summer 140, and amplifier 124 in circuit 80a, FIG. 5.

Another advantage of this invention is that the offset of stage 42a, FIG. 4, can be stored during the track phase, $\Phi_1$, on capacitors 100, 102, effectively canceling that offset during the hold phase, $\Phi_2$.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. An a.c. coupled multistage high gain operational amplifier comprising:
    at least two gain stages, each having an input and an output;
    an a.c. coupling level shifting capacitance interconnecting the output of a first stage to the input of a second stage; and
    a charging circuit interconnecting with said a.c. coupling level shifting capacitance and said input of said second stage to charge said a.c. coupling level shifting capacitance in a track phase and to connect said a.c. coupling capacitance to the input of said second stage during a hold phase for dissociating the bias voltage of the stages.

2. The a.c. coupled multistage high gain operational amplifier of claim 1 in which said charging circuit includes a common mode switching circuit interconnected with said a.c. coupling level shifting capacitance and said input of said second stage to charge said a.c. coupling level shifting capacitance in said track phase and to connect said a.c. coupling level shifting capacitance to the input of said second stage during said hold phase.

3. The a.c. coupled multistage high gain operational amplifier of claim 2 further including a common mode bias circuit for charging said a.c. coupling level shifting capacitance during said track phase.

4. The a.c. coupled multistage high gain operational amplifier of claim 1 in which said stages are implemented in NMOS.

5. The a.c. coupled multistage high gain operational amplifier of claim 1 in which there is a parasitic capacitance associated with said input of said second stage and said a.c. coupling level shifting capacitance is larger than said parasitic capacitance.

6. The a.c. coupled multistage operational amplifier of claim 1 in which said second stage includes a telescopic amplifier.

7. The a.c. coupled multistage high gain operational amplifier of claim 6 in which said telescopic amplifier includes a tail current source.

8. The a.c. coupled multistage high gain operational amplifier of claim 1 in which said a.c. coupling level shifting capacitance cancels the offset of said first stage.

9. An a.c. coupled multistage high gain operational amplifier comprising:
    at least two gain stages, each having an input and an output;
    an a.c. coupling level shifting capacitance interconnecting the output of a first stage to the input of a second stage; and
    a charging circuit interconnecting with said a.c. coupling level shifting capacitance and said input of said second stage to charge said a.c. coupling level shifting capacitance in a track phase and to connect said a.c. coupling capacitance to the input of said second stage during a hold phase for dissociating the bias voltage of the stages, said charging circuit including a common mode switching circuit interconnected with said a.c. coupling level shifting capacitance and said input of said second stage to charge said a.c. coupling level shifting capacitance in said track phase and to connect said a.c. coupling level shifting capacitance to the input of said second stage during said hold phase.

10. The a.c. coupled multistage high gain operational amplifier of claim 9 further including a common mode bias circuit for charging said a.c. coupling level shifting capacitance during said track phase.

11. An a.c. coupled multistage high gain operational amplifier comprising:
    at least two gain stages, each having an input and an output;
    an a.c. coupling level shifting capacitance interconnecting the output of a first stage to the input of a second stage; and
    a charging circuit interconnecting with said a.c. coupling level shifting capacitance and said input of said second stage to charge said a.c. coupling level shifting capacitance in a track phase and to connect said a.c. coupling capacitance to the input of said second stage during a hold phase for dissociating the bias voltage of the stages, wherein a parasitic capacitance is associated with said input of said second stage and said a.c. coupling level shifting capacitance is larger than said parasitic capacitance.

* * * * *